United States Patent [19]

Mathew et al.

[11] Patent Number: 4,800,178
[45] Date of Patent: Jan. 24, 1989

[54] METHOD OF ELECTROPLATING A COPPER LEAD FRAME WITH COPPER

[75] Inventors: Ranjan J. Mathew; Billy J. Lang, II, both of San Jose, Calif.

[73] Assignee: National Semiconductor Corporation, Santa Clara, Calif.

[21] Appl. No.: 96,987

[22] Filed: Sep. 16, 1987

[51] Int. Cl.⁴ .................. H01L 21/60; H01L 23/48
[52] U.S. Cl. ..................... 437/206; 437/246; 437/210; 437/220; 156/666; 206/330; 204/44; 427/123
[58] Field of Search ............ 437/221, 246, 206, 210; 156/629, 656, 666; 204/34.5, 44; 206/330; 427/123

[56] References Cited

U.S. PATENT DOCUMENTS 4,714,517 12/1987 Malladi et al. .................. 156/656

Primary Examiner—Brian E. Hearn
Assistant Examiner—Beverly A. Pawlikowski
Attorney, Agent, or Firm—Gail W. Woodward; Lee Patch; Mark Aaker

[57] ABSTRACT

The copper tape that is used in the tape assembly of semiconductor devices is provided with a bondable surface by an electroplated layer of copper. The copper tape is passivated in a weak organic acid solution immediately after plating. In the preferred embodiment the copper tape is also cleaned and passivated prior to electroplating. The passivated copper can be thermosonically bonded using gold wires for up to 144 hours after preparation. The elimination of noble metal plating reduces assembly cost and the passivated copper bonds well to the subsequently applied plastic encapsulant.

5 Claims, 1 Drawing Sheet

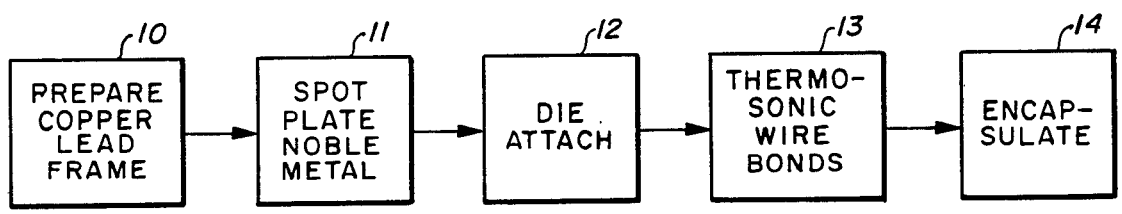
Fig_1 (PRIOR ART)
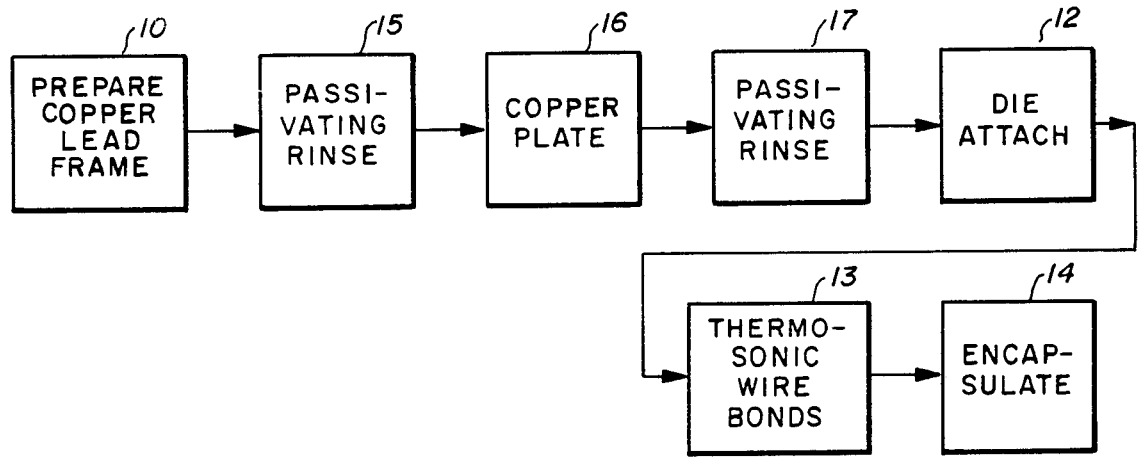
Fig_2

METHOD OF ELECTROPLATING A COPPER LEAD FRAME WITH COPPER

BACKGROUND OF THE INVENTION

Plastic encapsulated semiconductor devices have proven to be reliable and economical to manufacture. Accordingly, they have become quite common. Typically, the semiconductor device is connected by way of a copper lead frame that provides a mounting base and contact pad connections. After the semiconductor device is mounted upon the lead frame and the bond pad interconnections made, a suitable plastic encapsulant is transfer molded around the lead frame so that flat metal leads extend as pins outward from the package. These pins can be bent to a suitable configuration for attachment to a printed wiring board or equivalent.

In the prior art when a copper lead frame is employed the parts that will contact the semiconductor device are coated with a suitable noble metal such as gold or silver. Since such metals are quite expensive it has been a common practice to spotplate the lead frame to preclude metal deposition in areas where no contact is to be made. This requires some form of masking and only reduces costly metal use. The noble metal coating is still employed. It would be highly desirable, from a cost standpoint, to totally eliminate the noble metal.

SUMMARY OF THE INVENTION

It is an object of the invention to eliminate noble metal coatings for copper lead frame semiconductor device assembly.

It is a further object of the invention to employ an assembly process for copper lead frame assembly of semiconductor devices wherein noble metal deposition is avoided.

These and other objects are achieved as follows. A copper lead frame is prepared for bonding by first electroplating a layer of copper over the entire lead frame surface. The plating is preceded and followed by a passivating rinse in a weak organic acid. After the plating and passivating has been achieved, the semiconductor device is attached to the lead frame in a conventional manner and the device bonding pads interconnected with the lead frame fingers by means of gold wires attached by thermosonic bonding. After this the devices are subjected to the conventional device assembly processing. The result is a copper lead frame assembly process devoid of noble metal plating and resulting in equivalent bondability and reduced cost. The plated lead frames also show improved adherence to the plastic encapsulant.

BRIEF DESCRIPTION OF THE DRAWING

FIG. 1 is a block diagram showing the prior art assembly process.

FIG. 2 is a block diagram of the assembly process of the invention.

DESCRIPTION OF THE PRIOR ART

FIG. 1 is a block diagram of the major steps employed in the prior art assembly of copper lead frame semiconductor devices. In block 10, a copper lead frame is prepared in the conventional manner. Typically, a copper tape is punched and/or or photo lithographically etched to form a series of lead arrays. Each array has outwardly extending leads that will ultimately form package pins and inwardly-extending leads that terminate in an array that mates with the bonding pad array located on the semiconductor device to be encapsulated. The outer pins form a standard pattern dictated by the kind of package being employed. For example, package arrays of 8, 10, 14, 16, 18, 20, 22, 28, 32 and 40 leads in a dual in-line configuration are common. The inner lead extensions form a so-called personality window having a configuration that accommodates the particular semiconductor device chip being employed. The lead frame also has a metal plate configured to accept the chip for mounting. In the lead frame preparation, the copper metal tape is cleaned to remove any surface contaminants.

In block 11 the lead frame is coated with a noble metal such as gold or silver in those regions where subsequent bonding is to occur. Notably, the chip accepting plate and the inner ends of the lead frame fingers are covered. This is done by spot electroplating that only applies the noble metal where it is needed. Such spot plating will reduce the noble metal cost by not applying it where it will not be needed. However, such spot plating requires some form of masking which is costly and trouble-some.

In block 12 the semiconductor chip or die is attached to the lead frame. This is commonly done by soldering or brazing, but organic adhesive mounting can be employed. In this latter case the organic adhesive can be rendered conductive by loading it with silver particles or their equivalent.

Block 13 calls for thermosonic wire bonding. In this bonding operation a gold wire is employed to connect the semiconductor bonding pads to the lead frame fingers. The gold wires are attached by heating them and pressing them against the surface to be contacted while the bonding tool is sonically agitated. The sonic agitation scrubs the wire against the bonding surface to produce a suitable adherence. Alternatively, thermocompression wire bonding can be employed.

Then, as shown in block 14, the assembly is encapsulated in a suitable plastic housing. In this operation a thermosetting plastic is heated to plasticize it and transfer molded around the lead frame so as to enclose the semiconductor device and the inner ends of the lead frame fingers. The outer ends of the lead frame fingers extend from the package to form pins that connect to the semiconductor device electrically and also provide the mechanical mounting means for the finished product. After molding the plastic is cured to thermoset it and thereafter provide a moisture resistant housing that protects the semiconductor device.

DESCRIPTION OF THE INVENTION

The block diagram of FIG. 2 shows the process of the invention. Where the operation is the same as it was in the prior art the FIG. 1 designations are employed. Therefore, block 10 and 12-14 are as described above. However, in block 15 a passivating rinse following lead frame preparation is employed. In accordance with the invention, the following detailed steps are performed. Lead frame strips are cut to a suitable length and located on racks that provide electrical contact to each strip. The strips are first degreased for five minutes in a conventional electrolytic alkaline cleaner, rinsed for two minutes in deionized water and immersed in an aqueous citric acid solution (100 grams/liter±50 grams/liter) for five minutes at room temperature. While citric acid is preferred a number of other weak organic acids can be employed. For example, tartaric, oxalic, malonic, succinic, glutaric, adipic, maleic, acetic, formic, propionic, butyric, valeric and caproic acids can be employed as alternatives.

The strips are again rinsed in deionized water for two minutes and copper electroplated. A ten minute immersion in the following bath is employed:

| ELEMENT | QUANTITY (Grams/Liter) |
|---|---|
| Copper ($Cu^{+2}$) | 14-20 |
| Sulfuric ($SO_4^{-2}$) | 55-80 |
| Chloride ($Cl^-$) | 20-100 |

The plating temperature is maintained at 70° C. to 100° C. and the current density at 1.4–2.3 amperes per square decimeter. The plating anodes are copper containing 0.04 to 0.06% phosphorous. The resulting layer of copper is between 1.5 and 3.75 microns thick, bright and organic free.

The plated strips are rinsed in deionized warer for two minutes and then, as shown in block 17, immersed in citric acid as was described for block 15. This is followed by a two minute rinse in deionized water. The strips are then blown free of water for fifteen minutes using an air knife and dried for thirty minutes in air at 80° C. The citric acid treatment acts to passivate the copper so that it will not readily oxidize when exposed to the atmosphere. It is preferred that after the above processing the strips be used within 24 hours. However, it has been found that good results are obtained if the strips are used within 144 hours if they are stored under a dry nitrogen atmosphere. Nascent copper quickly oxidizes and the resultant oxide can interfere with bonding. Without the citric acid treatment the copper plated parts must be bonded immediately.

The finished strips are ready for die bonding, wire bonding and encapsulation using conventional assembly processing. Parts made using the process of the invention were compared with those employing the prior art approach. Considerable cost savings were documented. The average wire bond pull strength was equal to or better than the prior art using either gold or silver spot plating both before and after high temperature storage. Die shear strength was found, on the average, to be about equal to spot plated devices. It was found that superior hermeticity was found after plastic encapsulation. This is thought to be a result of better adherence to the passivated copper. The packaged devices tested all survived high temperature/high humidity storage for 1000 hours as well as an accelerated bias moisture test for 8000 hours. The devices all survived 4000 cycles of temperature cycling between −65° C. and 150° C., an autoclave test for 1000 hours (at 121° C., 15 PSI and 100% R.H.) and 150° C. operating life test to 1000 hours.

The invention has been described and its performance detailed. When a person skilled in the art reads the foregoing description, alternatives and equivalents, within the spirit and intent of the invention, will be apparent. Accordingly, it is intended that the scope of the invention be limited only by the following claims.

We claim:

1. A process for treating a copper lead frame tape that is to be used in the tape assembly of semiconductor devices, said process comprising the steps:
   cleaning said copper tape to remove surface contaminants;
   electroplating a layer of copper on said cleaned copper tape;
   passivating the surface of said electroplated layer by immersing it in a solution containing a weak organic acid;
   rinsing said passivated copper tape;
   bonding a semiconductor device to said tape; and
   thermosonically bonding gold wires between said tape and said semiconductor device.

2. The process of claim 1 wherein said electroplating step is preceded by the steps:
   passivating said cleaned copper tape by immersing it in a solution containing a weak organic acid; and
   rinsing said passivated copper tape.

3. The process of claim 1 wherein said weak organic acid is selected from the group consisting of citric, tartaric, oxalic, malonic, succinic, glutaric, adipic, maleic, acetic, formic, propionic, butyric, valeric and caproic acids.

4. The process of claim 1 wherein said weak organic acid is citric acid.

5. The process of claim 1 further including the step of transfer molding a plastic encapsulant around said semiconductor device and portions of said copper tape.

* * * * *